United States Patent [19]
Sebesta et al.

[11] Patent Number: 6,013,417
[45] Date of Patent: Jan. 11, 2000

[54] PROCESS FOR FABRICATING CIRCUITRY ON SUBSTRATES HAVING PLATED THROUGH-HOLES

[75] Inventors: Robert David Sebesta, Endicott; James Warren Wilson, Vestal, both of N.Y.

[73] Assignee: International Business Machines Corporation, Armonk, N.Y.

[21] Appl. No.: 09/054,374

[22] Filed: Apr. 2, 1998

[51] Int. Cl.[7] .................................................. G03F 7/00
[52] U.S. Cl. ..................... 430/312; 430/313; 430/314; 430/318; 216/17; 427/97
[58] Field of Search .................................. 430/312, 313, 430/314, 318; 216/17, 18, 19; 427/97

[56] References Cited

U.S. PATENT DOCUMENTS

| | | | |
|---|---|---|---|
| 4,566,186 | 1/1986 | Bauer et al. | 29/852 |
| 4,911,796 | 3/1990 | Reed | 204/15 |
| 4,945,029 | 7/1990 | Bronnenberg | 430/316 |
| 4,983,252 | 1/1991 | Masui et al. | 156/630 |
| 5,270,903 | 12/1993 | McMichen et al. | 361/760 |
| 5,277,929 | 1/1994 | Seki et al. | 427/97 |
| 5,427,895 | 6/1995 | Magnuson et al. | 430/314 |
| 5,707,893 | 1/1998 | Bhatt et al. | 437/195 |

FOREIGN PATENT DOCUMENTS 4339019  5/1995  Germany.

*Primary Examiner*—Sharon Gibson
*Assistant Examiner*—Jill N. Holloman
*Attorney, Agent, or Firm*—Pollock, Vande Sande & Amernick; Lawerence R. Fraley

[57] ABSTRACT

Circuitry is formed on a substrate having at least one plated through-hole employing two different photoresist materials. A first photoresist is applied on a conductive layer located on a substrate and is developed to define a desired conductive circuit pattern. A second photoresist is laminated onto the structure and is developed so that the second photoresist material remains in the vicinity of the through-hole. The conductive layer is etched to provide the desired circuit pattern, and the remaining portions of the second and first photoresists are removed.

9 Claims, 3 Drawing Sheets

PROCESS FOR FABRICATING CIRCUITRY ON SUBSTRATES HAVING PLATED THROUGH-HOLES

DESCRIPTION

1. Technical Field

The present invention is concerned with a process for providing circuitry on substrates having plated through holes. The present invention is especially advantageous for providing fine line circuitry. More particularly, the present invention provides the desired circuitry while at the same time protects the plated through-holes during the processing.

2. Background of Invention

A printed circuit board or card serves as a support substrate for various individual electronic components such as integrated circuits, resistors, and capacitors. The printed circuit board or card also provides the metallic conductors for conveying electrical current between the connected terminals of the electronic components. In addition, conductors on opposite sides of the board or card are frequently connected by plated through-holes. Plated through-holes are created by plating copper or some other metal onto the side walls of the through-holes formed through the circuit board or card, between the conductors on opposite sides of the substrate.

An ever-continuing trend in printed circuit boards and cards, that is, laminate packaging, is the demand for higher circuit density and/or more layers of circuitry. For instance, wire bond die manufacturers continue to shrink die size in order to achieve increased die per wafer, thereby lowering the cost per die. The packages for such must provide bond pads with smaller pitch than are currently available, some as low as 60 $\mu$m.

Moreover, the rapid emergence of flip chip bumping vendors is creating a demand for laminate packages with flip chip patterns capable of supporting pad pitches as low as 8 or 9 mils. However, conventional printed circuit board factories employ ½ oz. copper and rather thick film resists which are capable of tenting plated through-holes and produce circuit lines 2–3 mils wide with spaces between lines of about 3–4 mils wide. However, these geometries are not sufficient for the new substrate requirements.

Thin film circuitization techniques have been employed on ceramic substrates to produce features now required on the laminate substrates. For example, thin film circuitry of 1 mil lines with 1 mil spaces between lines has been achieved by providing a layer of relatively thin metal of about 5 $\mu$m thick along with relatively thin photoresist, for instance approximately 3 $\mu$m thick, being applied typically by spraying or spinning. The use of the thin metal along with a relatively thin layer of photoresist permits subtractive circuitization providing fine line circuit patterns. However, these thin photoresist layers are not capable of tenting or protecting plated through-holes that might exist on the printed circuit board or card. On the other hand, relatively thick film resists, although protecting plated through-holes, cannot provide fine line circuitization. Achieving fine line circuitization has competed with and has been contradictory to achieving protection of already-existing plated through-holes. Accordingly, it would be desirable to provide a process that is capable of providing fine line circuitization while at the same time resulting in protection of the plated through-holes.

SUMMARY OF THE INVENTION

The process of the present invention makes it possible to fabricate fine line circuitry on substrates having plated through-holes. The process of the present invention comprises providing a dielectric substrate having an electrically conductive layer thereon and having at least one plated through-hole. A first photoresist is applied onto the conductive layer. The first photoresist has a thickness of up to about 4 $\mu$m. The first photoresist is imagewise exposed and developed to define a desired circuit pattern having at least some portions of high density circuitry and other areas of lower density circuit adjacent to at least one through-hole. A second photoresist is laminated onto the structure. The second photoresist has a thickness of at least about 1 mil. The second photoresist is imagewise exposed and developed leaving it remaining only over and in the vicinity of the first resist at the through-hole locations.

The exposed portions of the conductive layer not protected by the remaining portions of the first and second photoresists are removed to thereby provide the desired conductive pattern. Next, the remaining portions of the first and second photoresists are removed Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
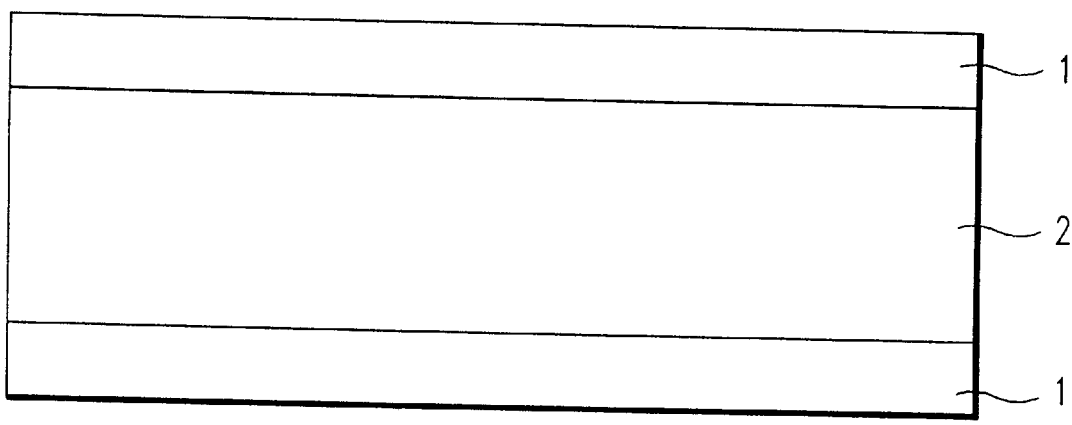
FIGS. 1–6 are schematic diagrams illustrating the process of the present invention.

In order to facilitate an understanding of the present invention, reference will be made to the drawing which schematically illustrates a procedure for providing fine line circuitization of substrates with plated through-holes without concomitantly jeopardizing the integrity of the plated through-holes.

A copper foil 1 is laminated to a dielectric substrate material 2 (see FIG. 1). The dielectric substrate material includes both thermoplastic and thermosetting polymers and preferably thermosetting polymers. Typical thermosetting polymeric materials to which the copper foil is laminated include epoxy, phenolic base materials, and polyimides. The dielectric materials may be molded materials of a polymer containing fillers and/or reinforcing agents such as glass filled epoxy or phenolic base materials. Examples of some phenolic type materials include copolymers of phenol, resorcinol and cresol. Examples of some suitable thermoplastic polymeric materials include polyolefins, such as polypropylene; polysulfones; polycarbonates; nitrile rubbers; and ABS polymers.

Bonding of a dielectric material substrate to the copper foil is carried out by pressing together a sheet of the dielectric substrate material and a sheet of the copper foil in a preheated laminating press at a predetermined pressure and temperature as for example about 260 to about 800 psi and generally at a temperature of about 170 to about 200° C. When typical commercially available ½ oz. copper is employed on both the top surface and bottom surface of the dielectric material 2, the copper is etched to provide a thickness down to about 4 to about 6 µm, typical of which is about 5 µm. The copper can be etched in a conventional copper etchant such as a cupric chloride or ferric chloride composition.

Figure 2:
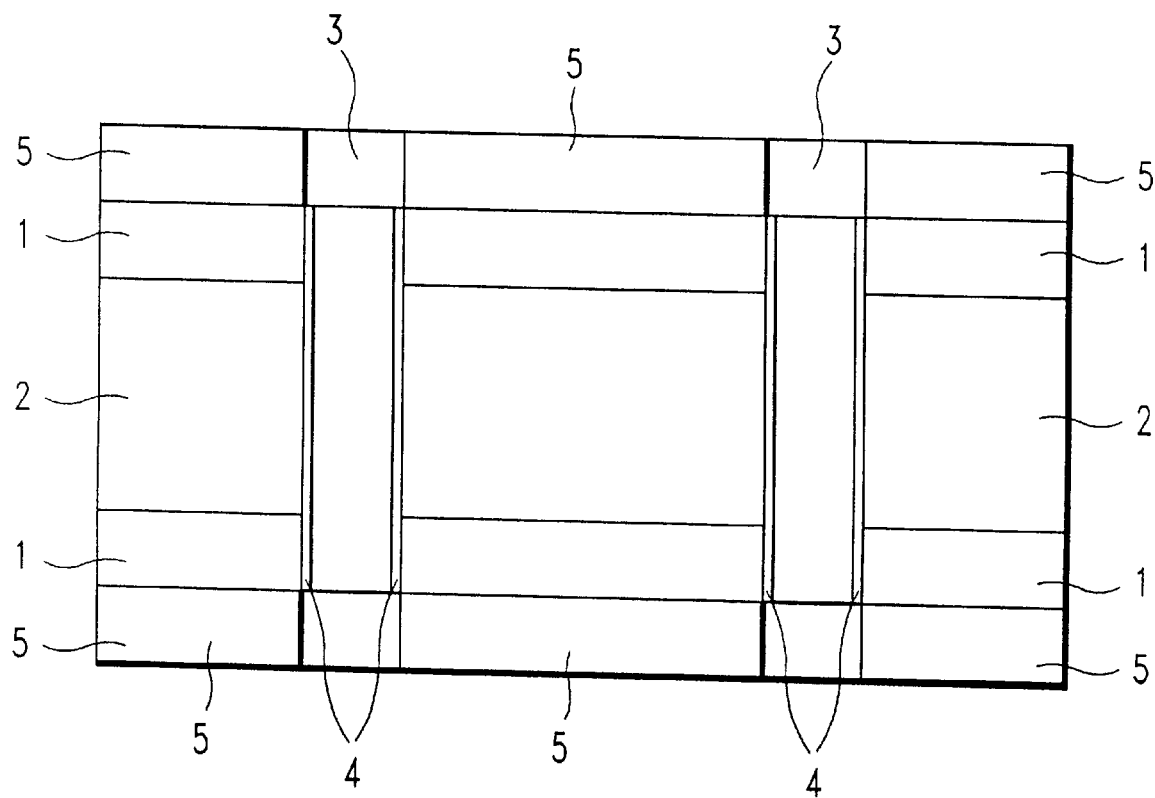

Through-holes 3 can then be drilled where desired through the copper coated substrate (see FIG. 2). The holes after drilling can then be cleaned to remove residue from the drilling by well known techniques. After this, the through-holes can be plated with copper by conventional processing techniques. For instance, the substrate and through-holes can be conditioned for electroless plating by procedures such as that disclosed in U.S. Pat. No. 4,478,883, disclosure of which is incorporated herein by reference. Such technique involves contacting the surfaces with a composition containing a multifunctional ionic polymer containing ionic moieties that are of a charge opposite from the charge associated with colloidal catalyst particles to be subsequently applied to the substrate. Next, palladium-tin colloid catalyst composition is employed. This can then be followed by an electroless copper plating procedure to provide a relatively thin copper layer 4 (see FIG. 2) of about 0.25 to about 1.5 µm, typical of which is about 1 µm. To complete the fabrication of the plated through-holes, a typical photoresist material 5 can be applied by spinning or spraying onto the substrate and then imagewise exposing to actinic light followed by developing in a suitable solvent to remove photoresist from over the through-holes and lands around the through-holes. The through-holes and lands can then be plated with, for example, copper 4 to the desired thickness by electroplating from a typical electroplating copper bath.

Figure 3:
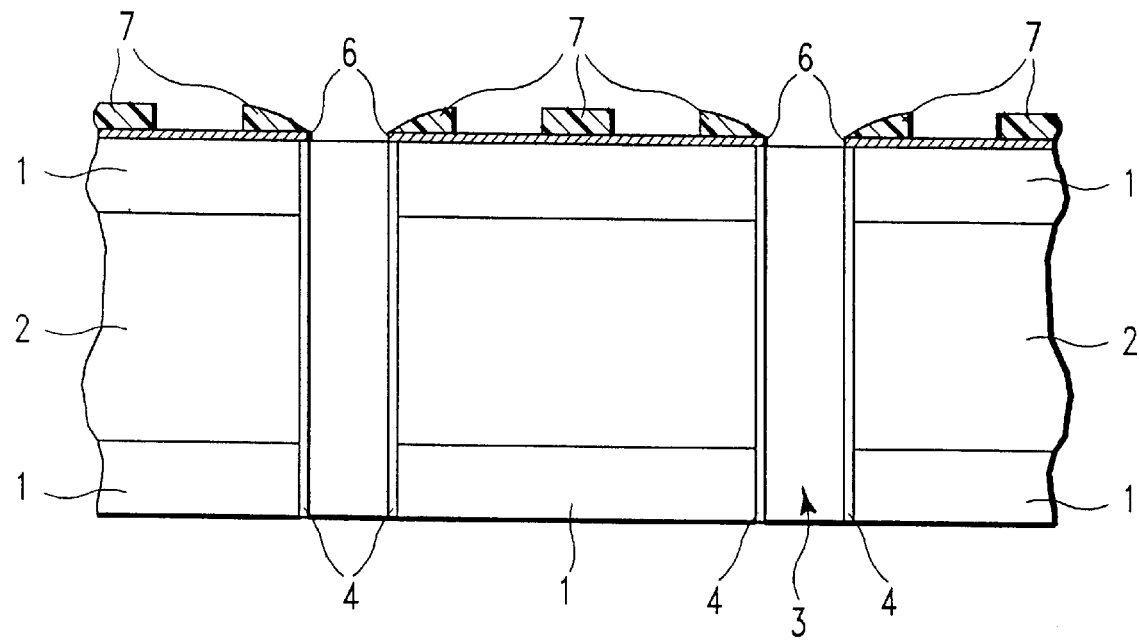

After plating, the photoresist can be stripped by dissolving in a suitable solvent, thereby providing the substrate with the plating through-holes to be treated in accordance with the technique of the present invention. If desired, a layer of chromium 6 can be provided on the top surface of the substrate above the copper layer for achieving desired adhesion to subsequently to be applied photoresist (see FIG. 3). The chromium layer is typically about 400 to about 1000 Å thick, and more typically about 600 to about 800 Å thick.

Next, according to the present invention, a relatively thin layer of a photoresist material 7 is sprayed or spun onto substrate. The photoresist layer has a thickness of about 2 to about 4 µm, typical of which is about 3 µm. The photoresist is preferably a negative photoresist. Examples of some suitable negative photoresist materials are disclosed in U.S. Pat. Nos. 3,469,982; 3,526,504 and 3,448,089, disclosures of which are incorporated herein by reference. The polymers of methylmethacrylate with glycidyl acrylate and/or pentaerythritol triacrylate are known negative photosensitive materials.

Other negative photosensitive resins include polyvinyl cinnamate derivatives such as those available under the trade designations KPR, KPR-2, KPR-3, and KR-4; Waycoat RC and 20 and polymers of a vinyl ester containing cinnamylidene such as available from Eastman Kodak under the trade designation KOR; allyl ester prepolymers such as available from Dynachem under the trade designation DCR. A particular example of an allyl ester resin is from diallyl isophthalate. Other negative photosensitive materials include cyclized derivatives of polyisoprene rubber such as those available under the trade designation KMER and KTFR from Eastman Kodak; Dynachem CMR and micro-g MICRO-G; Waycoat IC, Waycoat SC and Waycoat 450 and hydrocarbon copolymers such as those available under the trade designations Dynachem CMR series.

In addition, the photosensitive compositions may include a sensitizer for the polymer. Such is generally employed in minor amounts such as about 1% to about 10% by weight. Since such sensitizers are well known in the art, a detailed discussion of them is not deemed necessary at this time. In addition, other additives to the negative resists such as phenolic-formaldehyde novolak resins in minor amounts for improving properties such as adhesion and reducing swelling during development have been suggested.

A discussion of various negative photoresist materials and solvents and additives therefor can be found, for example, in *Photoresist Materials and Processes*, Deforest, McGraw-Hill Book Co., New York, N.Y., 1975, pp. 20–47, disclosure of which is incorporated herein by reference.

A particular photoresist employed pursuant to the present invention is Waycoat SC100 which can be applied by spinning or spraying onto the major surfaces of the substrate. Other known techniques such as flowing, roller coating and dip coating can be employed if desired.

After the photosensitive composition is applied to the substrate, the solvent for the photosensitive material is removed by evaporation. The evaporation can be aided, if desired, by low temperature baking. Removal of the solvent leaves a layer resist material on the surface of the substrate. The layer, as discussed above, of the photosensitive material for the purposes of the present invention is about 2 to about 4 microns thick.

The photosensitive material is then exposed to actinic radiation in the desired pattern and then developed. When the photosensitive material is a negative resist, the unexposed portion is removed by a suitable solvent.

When employing a photoresist such as Waycoat, the unexposed portion is removed by employing a suitable solvent such as xylene, followed by an n-buytylacetate rinse.

Since the methods of exposing and developing photoresists are well known in the art, such need not be described herein in any great detail. After development of the photosensitive material to provide the desired pattern on the substrate, the photosensitive material can be post-baked at a temperature of for example about 80° C. to about 140° C. to ensure against undercutting during the subsequent processing.

The exposed chromium not protected by the remaining portions of the photoresist material can be patterned by etching. Typical etching compositions for the chromium include aqueous compositions containing $KMnO_4$ and acidic aqueous compositions containing an inorganic acid and optionally polyvinyl alcohol.

This photoresist layer is patterned so as to define the desired circuit pattern subsequently to be created. The desired pattern is typically a fine line or high density circuitization having lines of up to 0.7 mil and more typically about 1.0 to about 1.5 mil wide, with spaces between lines of up to 1.1 mil and more typically about 1.5 to about 2.0 mil. Negative resists sufficiently thin (e.g. 3 µm) to have this line/space resolution capability are typically incapable of protecting underlying metal at the perimeter of through-holes or tenting those through-holes.

Figure 4:
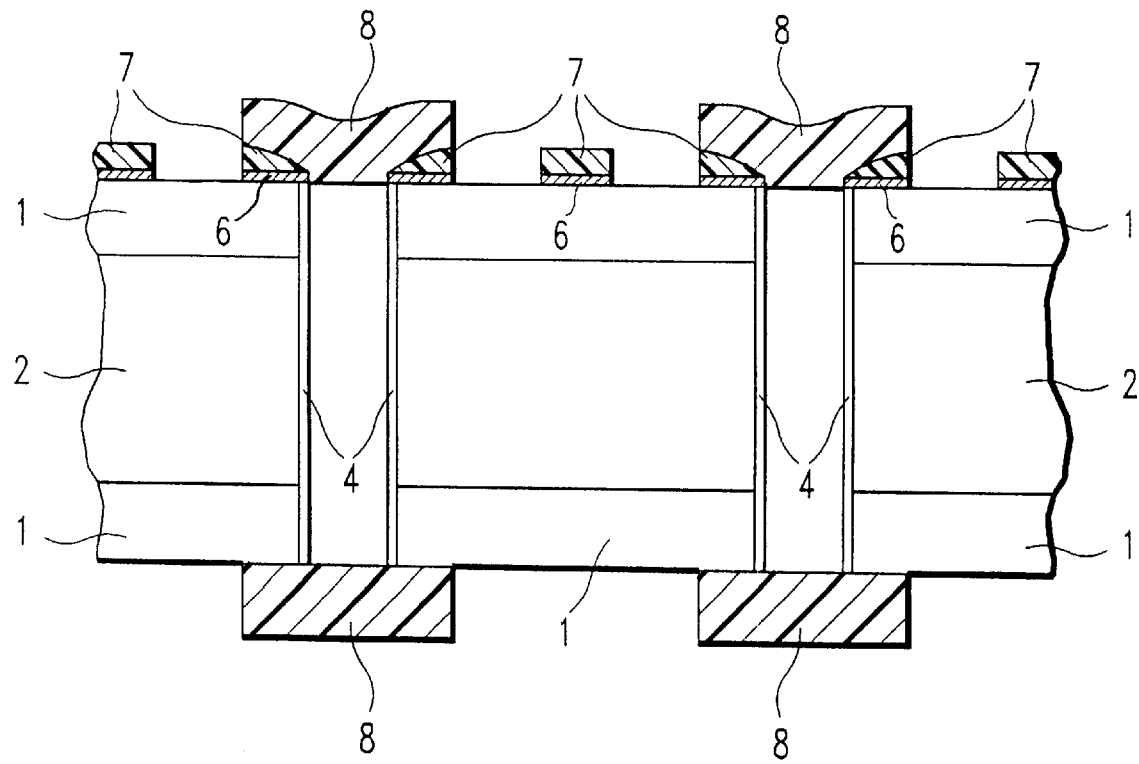

Next, a second photoresist 8 is laminated onto the major surfaces of the substrate and over photoresist layer 7 (see FIG. 4). The second photoresist layer provides a thickness of at least 1 mil and more typically about 2 to about 5 mils. The laminating is typically carried out at a pressure of about 50 to about 90 psi at about 2 to about 4 meters/min, and at a temperature from about 100 to about 150° C. If desired, the photoresist can be in the form of a composite that contains a backing such as a polyester backing for facilitating handling of the photoresist. After it is applied, then the backing is removed.

Preferably, the second photoresist is also a negative resist. Some commercial photoresists that are available in the thicknesses required according to the present invention are 9008 and SF206 resist from Hercules. SF206 is an acrylate or methacrylate based negative photoresist. After the second photoresist is applied to the substrates, such is exposed to actinic radiation in the desired pattern and then developed. More particularly, the second photoresist located on the top surface of the substrate is patterned so that only photoresist material covering or tenting the first photoresist 7 at the plated through-holes and small land in the vicinity of the through-holes remains, and is removed from at least those portions of the substrate where the fine line circuitization is to be provided. On the bottom surface of the substrate, the second photoresist can be patterned so that such remains not only tenting the plated through-holes and providing resist on lands in the vicinity of the through-holes but also on the desired circuit pattern since the circuitization is not the fine line circuitization required on the top surface of the substrate, but instead provide somewhat wider circuit lines and spaces such as about 2–3 mils wide.

The unexposed portions of the second photoresist are removed by employing a dilute aqueous NaOH solution. Since the methods of exposing and developing the photoresists are well known in the art, such need not be described herein in any great detail. After development to provide the desired patterns, the second photoresist can be post-baked to assure against undercutting during the subsequent processing. For instance, such can be post-baked at a temperature of about 80° C. to about 140° C.

Figure 5:
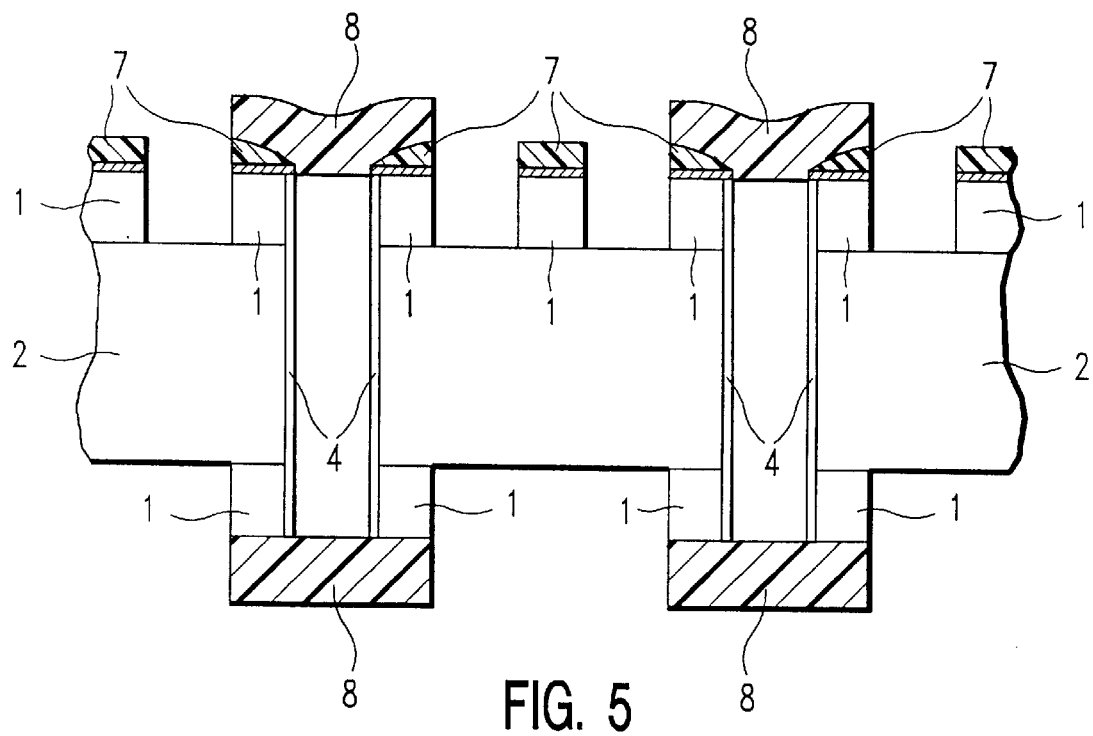

Next, the exposed copper circuitry not protected by the two photoresist layers is etched in a typical copper etchant such as cupric chloride or ferric chloride. See FIG. 5.

This provides the fine line circuitization on the top of the substrate as well as the necessary circuitization on the bottom of the substrate while at the same time adequately protecting the already plated through-holes.

Figure 6:
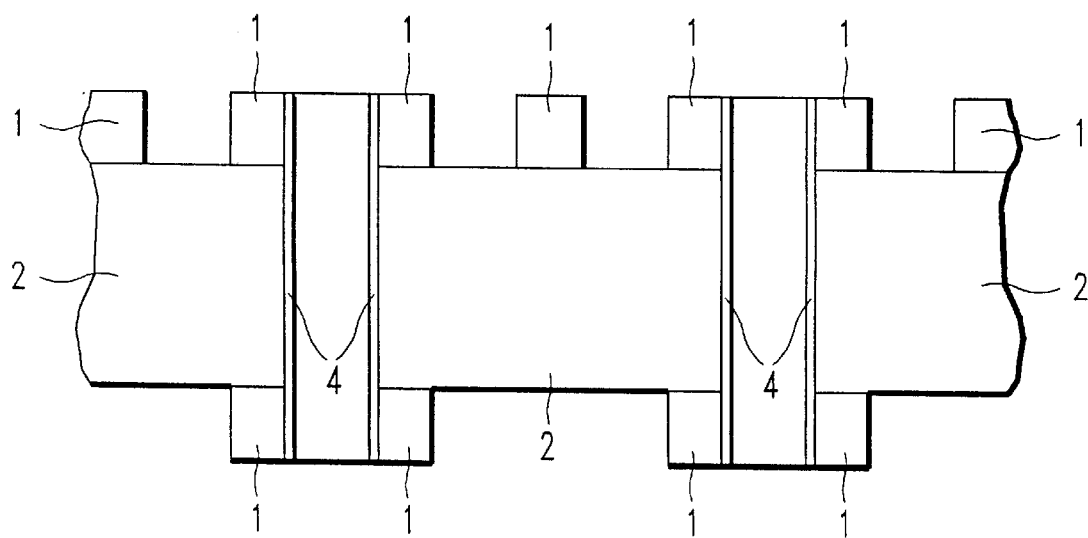

The remaining portions of the second photoresist are then removed by stripping such as in dissolution in a strong aqueous NaOH solution. After the second photoresist material is removed, the remaining portions of the first photoresist material is then stripped such as by dissolution in a suitable solvent such as J-100. The remaining chromium is then etched such as by dissolution in a suitable chromium etchant composition such as one of the compositions discussed above. See FIG. 6.

The thickness of the circuit lines can then be increased to its desired thickness such as employing a suitable electroless plating bath such as electroless copper plating bath or nickel/gold plating bath. Typical final thicknesses are about 1.0 to about 1.5 mils.

The circuitized substrate can then be subjected to subsequent further conventional processing.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process for forming circuitry on a substrate having at least one plated through-hole which comprises:

providing a dielectric substrate having an electrically conductive layer thereon;

applying a first photoresist on said conductive layer having a thickness of 2 $\mu$m to 4 $\mu$m, exposing and developing to define a desired conductive circuit pattern;

laminating a second photoresist having a thickness of about 1 mil to 5 mil, exposing and developing said second photoresist leaving said second photoresist over the first photoresist in the vicinity of said at least one through-hole and being removed from the areas on said substrate where fine line circuitization is to be subsequently provided; and then etching the exposed conductive layer not protected by the patterned first and second photoresists to thereby provide the desired conductive circuit pattern; and removing the remaining portions of said second photoresist and said first photoresist.

2. The process of claim 1 wherein said electrically conductive layer is copper.

3. The process of claim 1 wherein the thickness of said first photoresist is about 3 $\mu$m.

4. The process of claim 1 wherein said first and second photoresists are negative photoresists.

5. The process of claim 1 wherein the thickness of said second photoresist is 1 to about 2 mils.

6. The process of claim 1 wherein said electrically conductive layer is applied to both major surfaces of said substrate, and wherein said second photoresist is laminated to both major surfaces of said substrate, and wherein the exposing and developing of said second photoresist leaves said second photoresist only over the first photoresist in the vicinity of said at least one through-hole on one of the major surfaces which surface is to contain fine line circuitization, and leaves said second photoresist on the other of the major surfaces of said substrate over and in the vicinity of said at least one through-hole and to define a desired circuit pattern.

7. The process of claim 6 wherein fine line circuitization contains lines of 0.7 mil to 1.5 mil wide.

8. The process of claim 1 wherein said circuit pattern is fine line circuitry of 0.7 mil to 1.5 mil wide.

9. The process of claim 1 which further includes plating the circuitry on said substrate to increase the thickness of the circuitry.

* * * * *